United States Patent [19]
Nakagawa

[11] Patent Number: 5,343,056
[45] Date of Patent: Aug. 30, 1994

[54] COMPOUND SEMICONDUCTOR DEVICE

[75] Inventor: Yoshikazu Nakagawa, Kyoto, Japan

[73] Assignee: Rohm Co., Ltd., Kyoto, Japan

[21] Appl. No.: 931,042

[22] Filed: Aug. 17, 1992

[30] Foreign Application Priority Data

Oct. 29, 1991 [JP] Japan .................................. 3-311827

[51] Int. Cl.$^5$ .................... H01L 29/205; H01L 29/80; H01L 29/161
[52] U.S. Cl. .................................... 257/191; 257/192; 257/194; 257/22
[58] Field of Search .................. 257/191, 192, 194, 22

[56] References Cited

U.S. PATENT DOCUMENTS

| 4,799,088 | 1/1989 | Hiyamizu et al. | 251/194 |
| 5,153,682 | 10/1992 | Goto et al. | 257/194 |

FOREIGN PATENT DOCUMENTS 2266874  5/1986  Japan .................................. 257/194

OTHER PUBLICATIONS

Salmer et al., "Modeling of MODFET's", *IEEE Transactions on Microwave Theory and Techniques*, vol. 36, No. 7, pp. 1124–1140 (Jul. 1988).
Archer et al., "Ka/Q-Band Broadband, Ka and W—Band Low Noise HEMT Amplifiers", *1989 IEEE Military Communications Conference*, vol. 1, pp. 735–738 (1989).
Wallis, R. H., "Effect of Free Carrier Screening on the Electron Mobility of GaAs: A Study by Field-Effect Measurements", *Physica B&C*, vol. 117-118, pp. 756–758 (1983), North Holland Publishing, Amsterdam.
Lee et al., "Charge Control Model of Inverted GaAs-AlGaAs Modulation Doped FET's (IMODFET's)", *Journal of Vacuum Science & Technology B (Microelectronics Processing and Phenomena)*, vol. 2, 2nd Seris, pp. 113–116 (1984).
Schubert et al., "Self-Aligned Enhancement-Mode and Depletion—Mode GaAs Field-Effect Transistors Employing the δ-Doping Technique", *Applied Physics Letters*, vol. 49, No. 25, pp. 1729–1731 (Dec. 1986).
European Search Report dated Dec. 14, 1993 in Application No. EP 92 11 4718.7.

*Primary Examiner*—William L. Sikes
*Assistant Examiner*—Fetsum Abraham
*Attorney, Agent, or Firm*—Brumbaugh, Graves, Donohue & Raymond

[57] ABSTRACT

A compound semiconductor device includes an undoped semiconductor layer; a doped semiconductor layer formed on the undoped semiconductor layer and having smaller electron affinity than the undoped semiconductor layer, impurities being doped in the doped semiconductor layer; a gate electrode formed on the doped semiconductor layer; and a source electrode and a drain electrode respectively formed at both sides of the gate electrode, wherein an impurity concentration of the doped semiconductor layer is selected such that a portion of the doped semiconductor layer located immediately below the gate electrode is not completely depleted in a state in which a gate voltage is not applied to the gate electrode, and is completely depleted in a state in which a negative voltage for minimizing a noise figure is applied to the gate electrode.

6 Claims, 2 Drawing Sheets

COMPOUND SEMICONDUCTOR DEVICE

BACKGROUND OF THE INVENTION

The present invention relates to a compound semiconductor device such as a HEMT (High Electron Mobility Transistor).

A HEMT structure is attracting attention as a field-effect transistor making use of a two-dimensional electron gas accumulated in a heterojunction interface. As shown in FIG. 1, this HEMT structure comprises an undoped semiconductor layer 2 disposed on a substrate 1; a doped semiconductor layer 3 whose electron affinity is smaller than that of the undoped semiconductor layer 2 and in which impurities are doped; a gate electrode 4 formed on the doped semiconductor layer 3; and a source electrode 6 and a drain electrode 7 which are respectively formed on a cap layer 5 at both sides of the gate electrode 4. Though the doped semiconductor layer 3 located immediately below the gate electrode is not completely depleted in a state in which the gate voltage is not applied, the two-dimensional electron gas accumulated in the heterojunction interface is directly controlled by the gate voltage which is under 0 volt.

However, with the conventional HEMT structure in which the doped semiconductor layer located immediately below the gate electrode is completely depleted in the state in which the gate voltage is not applied, the source resistance is large, and the noise characteristic in a high frequency is deteriorated. To explain this point, first, the source resistance is expressed by the sum of the contact resistance between the source electrode 6 and the cap layer 5 and the sheet resistance of the epitaxial growth layer. As shown in FIG. 1, the sheet resistance of the epitaxial growth layer is further divided into portions (A) and (B), as shown in FIG. 1, and the resistance is particularly large in portion (B). The reason for this is that a plurality of current paths exist in portion (A), as shown at I1 and I2, and its resistance is therefore relatively small, whereas the number of paths is small in portion (B), as shown at I3.

An energy band in a state in which the gate voltage is not applied and the doped semiconductor layer located immediately below the gate electrode is completely depleted, is slightly high as a whole for both portion (B) and the portion located immediately below the gate electrode, as shown by the solid line in FIG. 5. As such, practically no electrons remain in the doped semiconductor layer located immediately below the gate electrode and, likewise, practically no electrons remain in the doped semiconductor layer in portion (B). Then, when a negative voltage is applied to the gate electrode, the energy band for portion (B) is not as high as at the portion located immediately below the gate electrode, but rises as shown by the dotted line in FIG. 5. For this reason, the amount of electrons becomes small at portion (B) where the amount thereof is originally small. Accordingly, in a state of use, the electrons at portion (B) are not sufficient, and a resistance value becomes large, so that the noise is correspondingly large.

To lower the resistance at portion (B), it suffices to increase the amount of electrons by increasing the impurity concentration of the doped semiconductor layer, but if the concentration is made excessively high, the portion of the doped semiconductor layer located immediately below the gate does not become depleted when the gate voltage is applied. Hence, if the device is operated in that state, it is impossible to obtain a satisfactory characteristic.

SUMMARY OF THE INVENTION

The present invention has been made in view of these points, and has an object to provide a compound semiconductor device of a HEMT structure in which the resistance value at the aforementioned portion (B) is reduced, and a noise figure is thereby improved.

To attain the aforementioned object, according to a first aspect of the present invention, there is provided a compound semiconductor device comprising: an undoped semiconductor layer; a doped semiconductor layer formed on the undoped semiconductor layer and having smaller electron affinity than the undoped semiconductor layer, impurities being doped in the doped semiconductor layer; a gate electrode formed on the doped semiconductor layer; and a source electrode and a drain electrode respectively formed at both sides of the gate electrode, wherein an impurity concentration of the doped semiconductor layer is selected such that a portion of the doped semiconductor layer located immediately below the gate electrode is not completely depleted in a state in which a gate voltage is not applied to the gate electrode, and is completely depleted in a state in which a negative voltage for minimizing a noise figure is applied to the gate electrode.

In addition, according to a second aspect of the present invention, an arrangement may be provided such that a planar doping region is provided in the vicinity of a center of the doped semiconductor layer, and impurities of the planar doping region located immediately below the gate electrode are not completely ionized in a state in which a gate voltage is not applied to the gate electrode, and are completely ionized in a state in which a negative voltage for minimizing a noise figure is applied to the gate electrode.

In accordance with the above-described first aspect of the present invention, since the doped semiconductor layer located immediately below the gate electrode is not completely depleted in a state of non-application of a gate voltage, the amount of electrons in portion (B) is sufficiently large. Even if a negative voltage is applied to the gate, the amount of the electrons in portion (B) does not decrease substantially, so that the source-side resistance becomes small. Moreover, since the doped semiconductor layer located immediately below the gate electrode is completely depleted in the state in which the negative voltage is applied to the gate voltage, the essential operating characteristic of the HEMT is not impaired.

In accordance with the above-described second aspect of the present invention, the source-side resistance is lowered by the planar doping region provided in the doped semiconductor layer, in the same way as in the above-described first arrangement according to the first aspect.

DETAILED DESCRIPTION OF THE INVENTION

Figure 1:
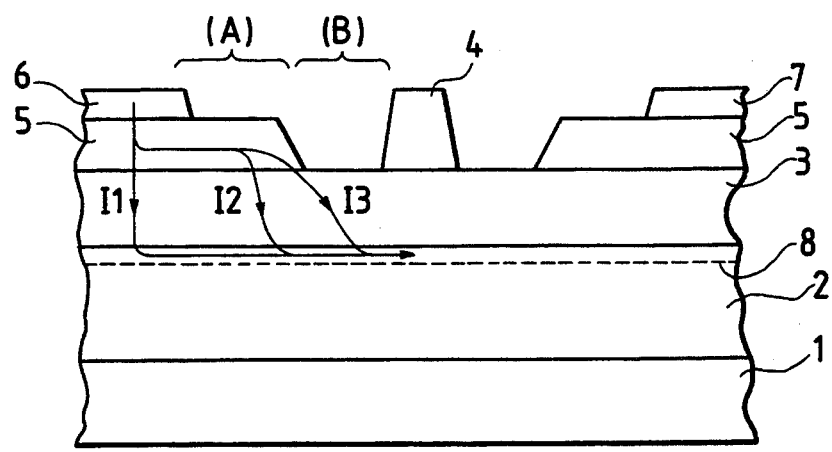
FIG. 1 is a diagram of the structure of a compound semiconductor device of a HEMT structure to which the present invention is applied.

In a first embodiment of the present invention, the structure of the compound semiconductor device itself is shown by a form similar to that of FIG. 1, but the first embodiment differs from the prior art in that the impurity concentration of the doped semiconductor layer is selected in such a manner as to satisfy the following conditions (1) and (2). That is, (1) The doped semiconductor layer located immediately below the gate electrode is not completely depleted in the state in which the gate voltage is not applied to the gate electrode. In other words, in the doped semiconductor layer located immediately below the gate electrode, the sum of a depletion layer extending from the gate electrode side and a depletion layer extending from the undoped semiconductor layer side is smaller than the thickness of the doped semiconductor layer.

Figure 2A:
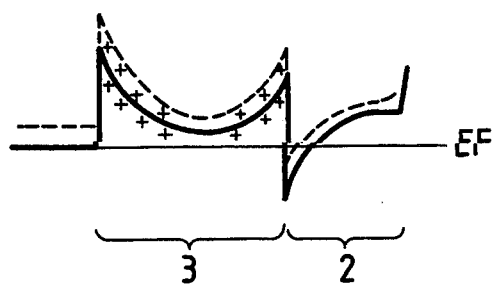
FIGS. 2(a) and 2(b) are energy band diagrams of the device according to the present invention.
Figure 2B:
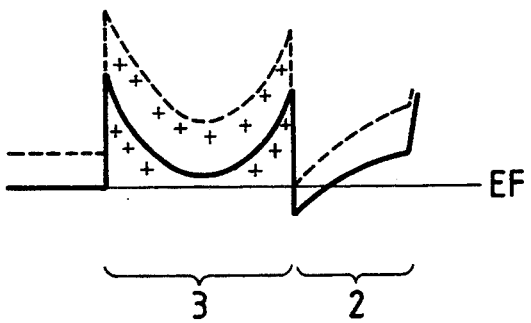

If this is shown in terms of an energy band, this means that, as shown by the solid line in FIG. 2(b), a portion in the vicinity of a Fermi level EF exists in the center of the doped semiconductor layer located immediately below the gate electrode.

(2) In a state in which a negative voltage for minimizing the noise figure is applied to the gate electrode, the doped semiconductor layer located immediately below the gate electrode is completely depleted (as shown by dotted line in FIG. 2(b)).

If the above-described measure is taken, the amount of electrons is large at portion (B) in the state of nonapplication of the gate voltage. If the negative voltage is applied to the gate electrode, the energy band immediately below the gate rises on the whole from the solid line (the nonapplied state) to the dotted line (the applied state), as shown in FIG. 2(b). However, the effect of the negative voltage applied to the gate is small at portion (B) in the doped semiconductor layer, and the energy band rises only slightly from the solid line (the nonapplied state) to the dotted line (the applied state), as shown in FIG. 2(a). Accordingly, since a state of sufficient existence of electrons is held in this portion (B), in the state of use (in the state in which the negative voltage is applied to the gate), the resistance at portion (B) is substantially low as compared with the prior art.

A noise figure NF is given by $$NF = 1 + K(f/fT)\sqrt{gm(Rs + Rg)}$$

In this formula, K is a fitting constant; f, a frequency; fT, a cutoff frequency; gm, the mutual conductance; Rs, the source resistance; and Rg, the gate resistance.

As can be seen from this formula, the noise is reduced in the HEMT having a small source resistance Rs as in the above-described first embodiment.

In the above-described first embodiment, for instance, an undoped semiconductor layer 2 is formed of GaAs or InGaAs containing Ga at a ratio of 0.8. A doped semiconductor layer 3 is formed of n+AlGaAs (at a ratio of 0.22 of Al and 0.78 of Ga) doped with silicon having a concentration in the range of $2.5 \times 10^{18}/cm^3$ to $6 \times 10^{18}/cm^3$ as impurities. In addition, a cap layer 5 is constituted by n+GaAs.

The undoped semiconductor layer 2, the doped semiconductor layer 3, and the cap layer 5 are formed consecutively on a substrate 1 through epitaxial growth.

Figure 3:
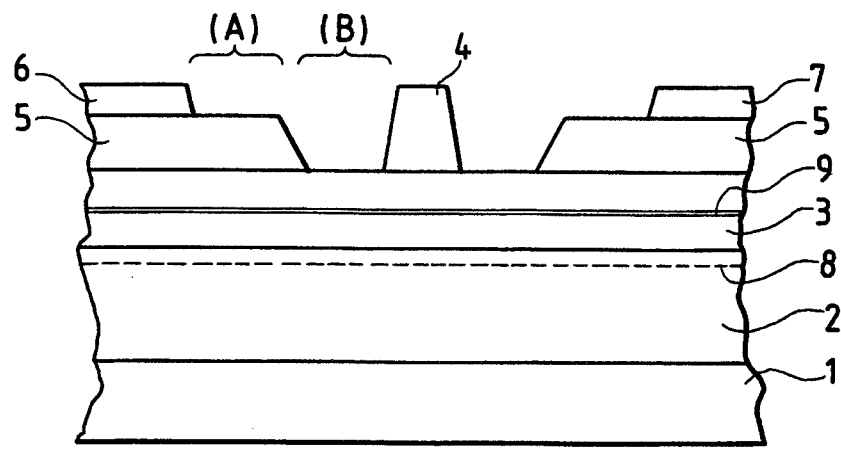
FIG. 3 is a diagram of the structure of a compound semiconductor device according to another embodiment of the present invention.
Figure 4:
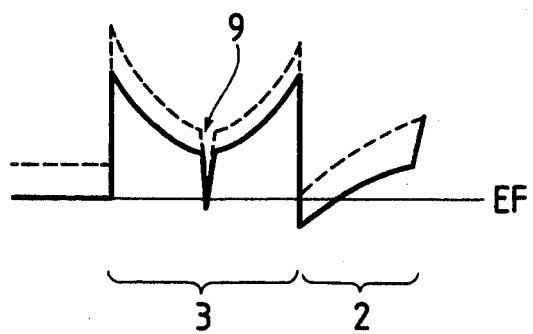
FIG. 4 is an energy band diagram of the device shown in FIG. 3.
Figure 5:
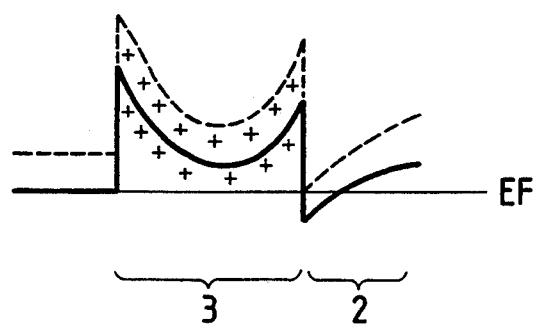
FIG. 5 is an energy band diagram of a conventional device.

Next, in a second embodiment, a planar doping region 9 is provided in the vicinity of the center of the doped semiconductor layer 3, as shown in FIG. 3. In this planar doping region 9, all the impurities thereof are not ionized in the state in which the voltage is not applied to a gate electrode 4, whereas all of them are ionized when a negative voltage for minimizing the noise is applied to the gate electrode. In the case of the second embodiment thus constructed, the source resistance becomes small for a reason similar to that for the above-described first embodiment, thereby reducing the noise. FIG. 4 shows an energy band for a portion located immediately below the gate electrode shown in FIG. 3. Here, the solid line is the case where the gate voltage is not applied, while the dotted line shows the case when the negative gate voltage is applied.

In the embodiment shown in FIG. 3, the planar doping region 9 is a portion of the doped semiconductor layer 3 of AlGaAs (Al: 0.22, Ga: 0.8) doped with Si in the range of $5 \times 10^{17}/cm^3$ to $2.0 \times 10^{18}/cm^3$, in which Si in the range of $5 \times 10^{11}/cm^2$ to $6 \times 10^{12}/cm^2$ is further doped. The other portions 2, 5 are formed of the same materials as those shown in FIG. 2.

As described above, in accordance with the compound semiconductor device of the present invention, advantages are obtained in that the source resistance becomes small, and that the noise figure is improved.

What is claimed is:

1. A compound semiconductor device comprising: an undoped semiconductor layer; a doped semiconductor layer formed on said undoped semiconductor layer and having smaller electron affinity than said undoped semiconductor conductor layer; a gate electrode formed on said doped semiconductor layer; and a source electrode conductor and a drain electrode conductor respectively formed on the doped semiconductor layer at both sides of said gate electrode, the source electrode conductor being spaced from the gate electrode by a selected spacing, wherein an impurity concentration of said doped semiconductor layer is selected such that, under the conditions of intended use of the device, a portion of said doped semiconductor layer located immediately below said gate electrode is not completely depleted in a state in which a gate voltage is not applied to said gate electrode, and is completely depleted in a state in which a negative voltage is applied to the gate electrode while avoiding depletion in the selected spacing for minimizing noise during operation of the device.

2. A compound semiconductor device as claimed in claim 1, wherein said impurity concentration of said doped semiconductor layer is $2.5 \times 10^{18}/cm^3$ or more.

3. A compound semiconductor device as claimed in claim 2, wherein said impurity concentration of said doped semiconductor layer is $6 \times 10^{18}/cm^3$ or less.

4. A compound semiconductor device comprising: an undoped semiconductor layer; a doped semiconductor layer formed on said undoped semiconductor layer and having smaller electron affinity than said undoped semiconductor layer, impurities being doped in said doped semiconductor layer; a gate electrode formed on said doped semiconductor layer; and a source electrode conductor and a drain electrode conductor respectively formed on the doped semiconductor layer at both sides of said gate electrode, the source electrode conductor being spaced from the gate electrode by a selected spacing, wherein a planar doping region is provided in the vicinity of a center of said doped semiconductor layer, and impurities of said planar doping region located immediately below said gate electrode are not completely ionized in a state in which a gate voltage is not applied to said gate electrode, and are completely ionized in a state in which a negative voltage is applied to the gate electrode while avoiding ionization in the selected spacing for minimizing noise during operation of the device.

5. A compound semiconductor device as claimed in claim 4, wherein an impurity concentration of said doped semiconductor layer is $2.0 \times 10^{18}/cm^3$ or less and impurities of $5 \times 10^{11}/cm^2$ or more is further doped in said planar doping region.

6. A compound semiconductor device comprising: an undoped semiconductor layer; a doped semiconductor layer formed on said undoped semiconductor layer and having smaller electron affinity than said undoped semiconductor layer, impurities being doped in said doped semiconductor layer; a gate electrode formed on said doped semiconductor layer; and a source electrode and a drain electrode respectively formed at both sides of said gate electrode, wherein a planar doping region is provided in the vicinity of a center of said doped semiconductor layer, and impurities of said planar doping region located immediately below said gate electrode are not completely ionized in a state in which a gate voltage is not applied to said gate electrode, and are completely ionized in a state in which a negative voltage for minimizing a noise figure is applied to said gate electrode, wherein an impurity concentration of said doped semiconductor layer is from $5 \times 10^{17}/cm^3$ to $2.0 \times 10^{18}/cm^3$, and impurities of $5 \times 10^{11}/cm^2$ to $6 \times 10^{12}/cm^2$ are doped in said planar doping region.

\* \* \* \* \*

UNITED STATES PATENT AND TRADEMARK OFFICE
CERTIFICATE OF CORRECTION

PATENT NO. : 5,343,056
DATED : August 30, 1994
INVENTOR(S) : Yoshikazu Nakagawa

It is certified that error appears in the above-identified patent and that said Letters Patent is hereby corrected as shown below:

<u>Column 4, line 36</u>: The words "conductor conductor layer" should read --conductor layer, impurities being doped in said doped semiconductor layer--.

Signed and Sealed this

Twenty-second Day of November, 1994

Attest:

BRUCE LEHMAN

Attesting Officer     Commissioner of Patents and Trademarks